US009013214B2

(12) United States Patent
Lee

(10) Patent No.: US 9,013,214 B2
(45) Date of Patent: Apr. 21, 2015

(54) SEMICONDUCTOR DEVICE AND SEMICONDUCTOR SYSTEM INCLUDING THE SAME

(71) Applicant: SK Hynix Inc., Gyeonggi-do (KR)

(72) Inventor: Hyun-Woo Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,503

(22) Filed: Dec. 13, 2013

(65) Prior Publication Data

US 2015/0042385 A1 Feb. 12, 2015

(30) Foreign Application Priority Data

Aug. 9, 2013 (KR) .......................... 10-2013-0094786

(51) Int. Cl.
*H03L 7/00* (2006.01)
*G06F 1/24* (2006.01)

(52) U.S. Cl.
CPC ........................................ *G06F 1/24* (2013.01)

(58) Field of Classification Search
USPC .................... 327/108–112, 379, 389, 391; 326/22–27, 81–87
See application file for complete search history.

(56) References Cited

U.S. PATENT DOCUMENTS

| 5,471,665 | A | * | 11/1995 | Pace et al. | 455/343.2 |
| 6,188,259 | B1 | * | 2/2001 | Amir et al. | 327/198 |
| 7,791,390 | B2 | * | 9/2010 | Kuroki | 327/231 |
| 2007/0182452 | A1 | * | 8/2007 | Shibata et al. | 326/82 |
| 2014/0145764 | A1 | * | 5/2014 | Lee | 327/142 |

FOREIGN PATENT DOCUMENTS

KR 100795027 1/2008

* cited by examiner

*Primary Examiner* — Brandon S Cole
(74) *Attorney, Agent, or Firm* — IP & T Group LLP

(57) ABSTRACT

A semiconductor device includes a buffer unit suitable for outputting a first signal of differential input signals as a positive signal, and a second signal of differential input signals as a negative signal in response to a setting signal, and a setting control unit suitable for generating the setting signal based on a level state of the positive signal and the negative signal in response to a reset signal.

18 Claims, 6 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2013-0094786, filed on Aug. 9, 2013, which is incorporated herein by reference in its entirety.

BACKGROUND

1. Field

Exemplary embodiments of the present invention relate to a semiconductor design technology, and more particularly, to a semiconductor device and a semiconductor system including the same for performing a mirror function.

2. Description of the Related Art

Recently, a semiconductor system uses a package structure of a mirror type to implement a high integration, a high band width and a high capacity thereof. For example, a first semiconductor device is mounted on a side of a substrate, and a second semiconductor device is mounted on the other side of the substrate so that the first semiconductor device is opposite to the second semiconductor device.

If the first semiconductor device and the second semiconductor device are fabricated in a same chip, a pad array of the first semiconductor device is symmetric to a pad array of the second semiconductor device. The first semiconductor device and the second semiconductor device may obtain a same signal through pads, which are opposite to each other based on a mirror function. That although the pads are included in the first semiconductor device and the second semiconductor device, respectively, the same signal inputted through the pads may be re-applied in the first semiconductor device and the second semiconductor device.

For example, if the a predetermined signal is applied to a first pad of the first semiconductor device, which is opposite to a second pad of the second semiconductor device, the predetermined signal is not re-distributed to the first semiconductor device through the first pad due to an inactivation of a mirror function while the predetermined signal is re-distributed to the second semiconductor device through the second pad due to an activation of a mirror function. Meanwhile a differential signal such as a clock signal is transferred through a direct routing path without being re-distributed.

FIG. 1 is a block diagram illustrating a conventional semiconductor system. FIG. 2 shows a routing path on a substrate between a first semiconductor device and a second semiconductor device shown in FIG. 1.

Referring to FIG. 1, the semiconductor system includes a controller 10, a first semiconductor device 20, a second semiconductor device 30, and a substrate 40.

The controller 10 generates differential clock signals CLK and CLKB and a reset signal RESETB. The controller 10 includes a processor such as a graphic processing unit (GPU), and controls an operation of the first semiconductor device 20 and the second semiconductor device 30.

The first and second semiconductor devices 20 and 30 perform a predetermined function in response to the differential clock signals CLK and CLKB and the reset signal RESETB, respectively. The first and second semiconductor devices 20 and 30 may include a dynamic random access memory (DRAM), and may be mounted on a substrate 40 in a symmetric structure corresponding to a mirror function. The first and second semiconductor devices 20 and 30 may include first pads (not shown which receive the differential clock signals CLK and CLKB and the reset signal RESETB. The first and second semiconductor devices 20 and 30 may include second pads (not shown), which receive a mirror function activation signal MF for controlling an activation of a mirror function. The mirror function activation signal MF indicates whether the first semiconductor device 20 and the second semiconductor device 30 perform the mirror function or not.

For example, if the second semiconductor device 30 is set to a mirrored semiconductor device, the first semiconductor device 20 does not activate a mirror function based on the second pad for the mirror function activation signal MF, which is coupled to a ground voltage (VSS) terminal, and the second semiconductor device 30 activates a mirror function based on the second pad for the mirror function activation signal MF, which is coupled to a power supply voltage (VDD) terminal.

The substrate 40 between the controller 10 and the first and second semiconductor devices 20 and 30 routes the differential clock signals CLK and CLKB and the reset signal RESETB. That is, the substrate 40 provides a routing path for transferring the differential signal's CLK and CLKB, the reset signal RESETB and the mirror function activation signal MF.

Especially, referring to FIG. 2, the substrate 40 provides a routing path for directly transferring the differential clock signals CLK and CLKB to pads PD1 and PD2 in the first pads of the first semiconductor device 20 and the second semiconductor device 30. In FIG. 2, the pad PD1 for receiving a positive clock signal CLK of the first semiconductor device 20 is opposite to the pad PD2 for a negative clock signal CLKB of the second semiconductor device 30, and the pad PD2 for the negative clock signal CLKB of the first semiconductor device 20 is opposite to the pad PD1 for the positive clock signal CLK of the second semiconductor device 30, on the basis of the substrate 40L However, in the conventional semiconductor system, a plurality of pads, which receive various signals provided from the controller 10, are physically coupled to the first and second semiconductor devices 20 and 30. Especially, the pads PD1 and PD2 directly receive the differential dock signals CLK and CLKB through the substrate 40 without supporting a mirror function. Thus, design for the routing path for transferring the differential dock signals CLK and CLKB may become complex and occupy a wide area.

Moreover, since the second pads for the mirror function activation signal MF are independently disposed in the first and second semiconductor devices 20 and 30, an area for the second pads for the mirror function activation signal MF may be occupied in the first and second semiconductor devices 20 and 30.

SUMMARY

Exemplary embodiments of the present invention are directed to a semiconductor device and a semiconductor system including the same for internally re-distributing differential clock signals inputted through pads, which are physically coupled, and controlling a mirror function.

Moreover, exemplary embodiments of the present invention are directed to a semiconductor device and a semiconductor system including the same for re-distributing a routing path for transferring differential clock signals.

In accordance with an exemplary embodiment of the present invention, a semiconductor device may include a buffer unit suitable for outputting a first signal of differential input signals as a positive signal and a second signal of differential input signals as a negative signal in response to a setting signal, and a setting control unit suitable for generating the setting signal based on a level state of the positive signal and the negative signal in response to a reset signal.

In accordance with an exemplary embodiment of the present invention, a semiconductor device may include a clock buffer unit suitable for outputting one of differential clock signals as a positive internal clock signal at a first output node, and the other of differential clock signals as a negative internal clock signal at a second output node in response to a setting signal, a sampling unit suitable for sampling the positive internal clock signal and the negative internal clock signal to output a sampling signal, and an inverting setting unit suitable for receiving the sampling signal and outputting the setting signal in response to a reset signal.

In accordance with an exemplary embodiment of the present invention, a semiconductor system may include a controller suitable for generating differential signals and a reset signal, and first and second semiconductor devices, each suitable for outputting a first signal of the differential signals as a positive signal and a second signal of the differential signals as a negative signal based on a level state of the differential signals in response to the differential signals and the reset signal.

DETAILED DESCRIPTION

Figure 1:
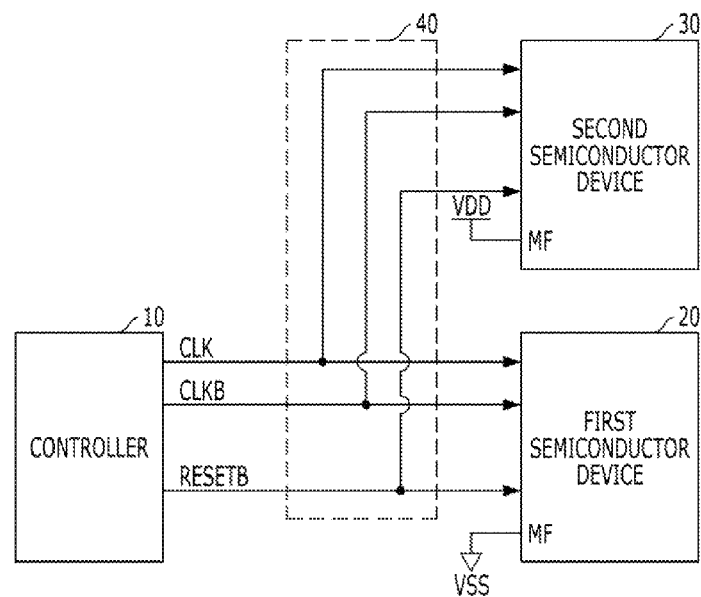
FIG. 1 is a block diagram illustrating a conventional semiconductor system.
Figure 2:
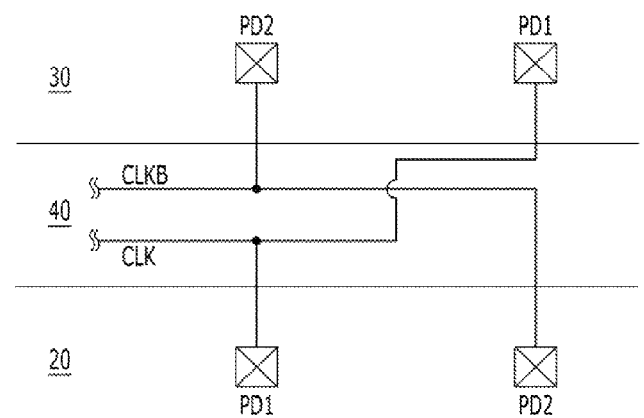
FIG. 2 shows a routing path on a substrate between a first semiconductor device and a second semiconductor device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
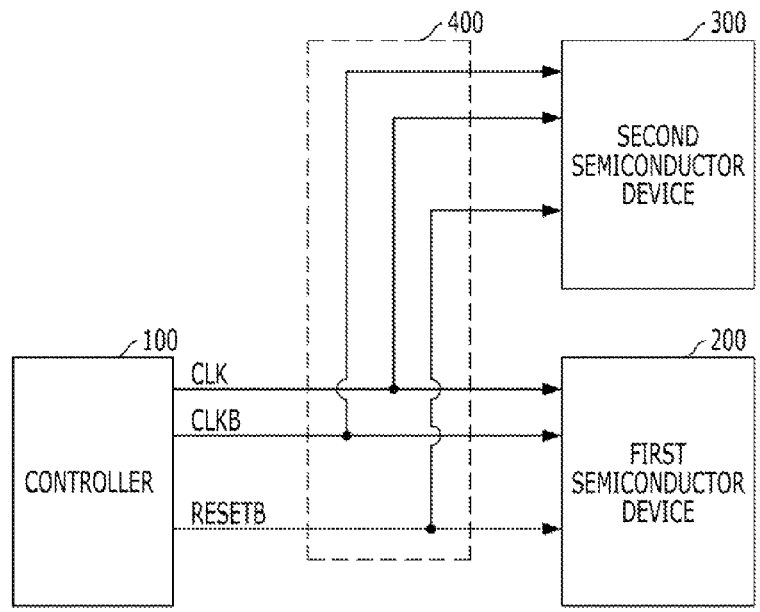
FIG. 3 is a block diagram illustrating a semiconductor system in accordance with an exemplary embodiment of the present invention.

FIG. 3 is a block diagram illustrating a semiconductor system in accordance with an exemplary embodiment of the present invention.

Referring to FIG. 3, the semiconductor system includes a controller 100, first semiconductor device 200, a second semiconductor device 300, and a substrate 400.

The controller 100 generates differential dock signals CLK and CLKB and a reset signal RESETB. The controller 100 includes a processor such as a graphic processing unit (GPU), and controls an operation of the first semiconductor device 200 and the second semiconductor device 300.

The first and second semiconductor devices 200 and 300 use one of the differential clock signals CLK and CLKB as a positive signal and the other of the differential clock signals CLK and CLKB as a negative signal based on a level state of the differential clock signals CLK and CLKB in response to the differential clock signals CLK and CLKB and the reset signal RESETB.

The first and second semiconductor devices 200 and 300 may include a dynamic random access memory (DRAM), and may be mounted on the substrate 400 with a structure corresponding to a mirror function, respectively. For example, the first semiconductor device 200 is mounted on a side of the substrate 400, and the second semiconductor device 300 is mounted on the other side of the substrate 400.

The substrate 400 is disposed between the first semiconductor device 200 and the second semiconductor device 300, which are opposite to each other on the basis of the substrate 400. The substrate 400 electrically couples the controller 100 to the first and second semiconductor devices 200 and 300, and provides routing paths for transferring the differential clock signals CLK and CLKB and the reset signal RESETB.

Especially, the substrate 400 provides the routing paths of a cross-coupled structure for transferring the differential clock signals CLK and CLKB. For example, the substrate 400 routes a positive clock signal CLK of the differential clock signals CLK and CLKB to a first pad PD1 of the first semiconductor device 200 and a second pad PD2 of the second semiconductor device 300 (referring to FIG. 10). The substrate 400 routes a negative clock signal CLKB of the differential clock signals CLK and CLKB to a second pad PD2 of the first semiconductor device 200 and a first pad PD1 of the second semiconductor device 300 (referring to FIG. 10). Moreover, the substrate 400 provides a routing path (not shown) for interfacing a power supply voltage with various signals, e.g., a command. The routing path may be minimized according to a mirror function.

Figure 4:
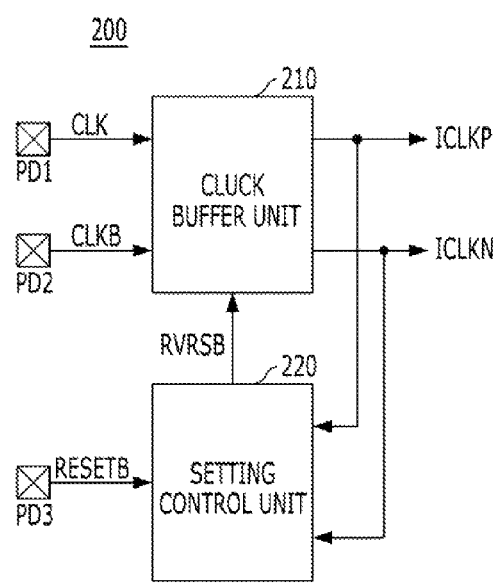
FIG. 4 is a block diagram illustrating a first semiconductor device shown in FIG. 3.
Figure 5:
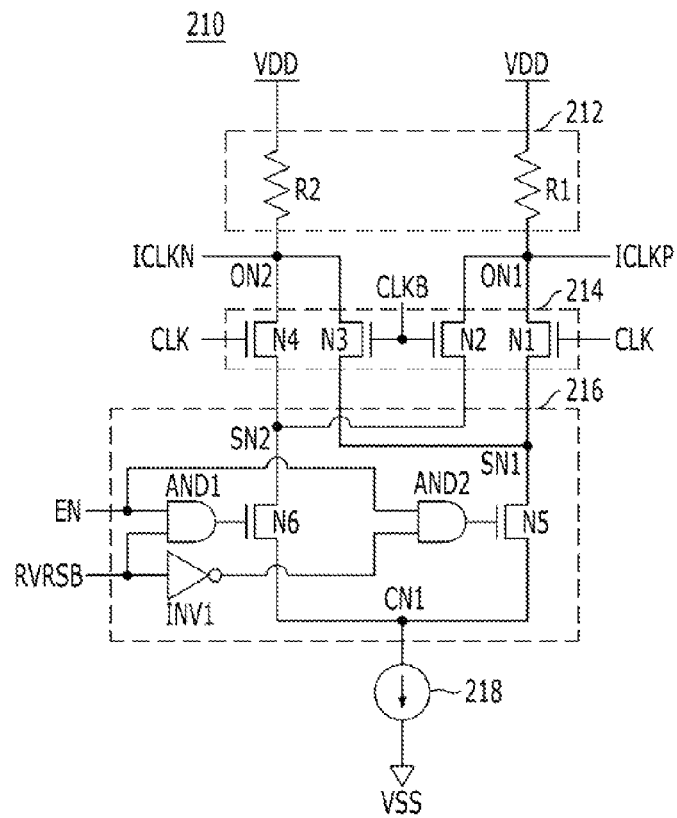
FIG. 5 is a circuit diagram illustrating a clock buffer unit shown in FIG. 4.
Figure 6:
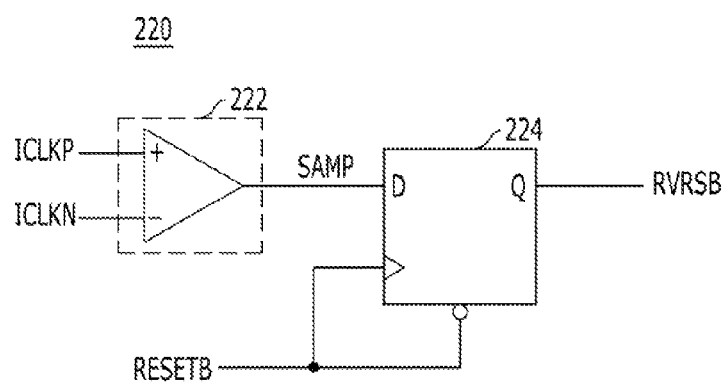
FIG. 6 is a circuit diagram illustrating a setting control unit shown in FIG. 4.

FIG. 4 is a block diagram illustrating the first semiconductor device shown in FIG. 3. FIG. 5 is a circuit diagram illustrating a clock buffer unit shown in FIG. 4. FIG. 6 is a circuit diagram illustrating a setting control unit shown in FIG. 4.

Referring to FIG. 4, the semiconductor device 200 includes a first pad PD1, a second pad PD2, a third pad PD3, a clock buffer unit 210, and a setting control unit 220.

The first pad PD1 receives the positive clock signal CLK of the differential dock signals CLK and CLKB. The second pad PD2 receives the negative clock signal CLKB of the differential clock signals CLK and CLKB. The third pad PD3 receives the reset signal RESETB.

The clock buffer unit 210 outputs a positive internal clock signal ICLKP of differential internal clock signals ICLKP and ICKLB corresponding to the positive clock signal CLK received through the first pad PD1, and outputs a negative internal clock signal ICLKN of the differential internal clock signals ICLKP and ICKLB corresponding to the negative clock signal CLKB received through the second pad PD2 in response to a setting signal RVRSB.

The setting control unit 220 generates the setting signal RVRSB based on a level state of the differential internal clock signals ICLKP and ICLKN in response to the reset signal RESETB.

Referring to FIG. 5, the clock buffer unit 210 includes a load unit 212, a differential input unit 214, an inverting selection unit 216, and a sinking unit 218.

The load unit 212 is coupled between differential output nodes ON1 and ON2 and a high voltage (VDD) terminal. A first output node ON1 outputs the positive internal clock signal ICLKP and a second output node ON2 outputs the negative internal clock signal ICLKN. The load unit 212 includes a first resistor unit R1, which is coupled between the high voltage (VDD) terminal and the first output node ON1, and a second resistance unit R2, which is coupled between the high voltage (VDD) terminal and the second output node ON2. In the exemplary embodiment, though the first and second resistance units R1 and R2 are implemented by resistors, they may be implemented with transistors for an active load.

The differential input unit 214 is coupled between the differential output nodes ON1 and ON2 and differential selection nodes SN1 and SN2, and receives the differential clock signals CLK and CLKB. A first selection node SN1 corresponds to the first output node ON1, and a second selection node SN2 corresponds to the second output node ON2.

The differential input unit 214 includes a first NMOS transistor N1, a second NMOS transistor N2, a third NMOS transistor N3, and a fourth NMOS transistor N4. The first NMOS transistor N1 is coupled between the first output node ON1 and the first selection node SN1, and has a gate receiving the positive clock signal CLK. The second NMOS transistor N2 is coupled between the first output node ON1 and the second selection node SN2, and has a gate receiving the negative dock signal CLKB. The third NMOS transistor N3 is coupled between the second output node ON2 and the first selection node SN1, and has a gate receiving the negative clock signal CLKB. The fourth NMOS transistor N4 is coupled between the second output node ON2 and the second selection node SN2, and has a gate receiving the positive clock signal CLK.

The inverting selection unit 216 is coupled between the differential selection nodes SN1 and SN2 and a common node CN1, and selects an inverting state of the differential internal clock signals ICLKP and ICKLB in response to the setting signal RVRSB. The inverting selection unit 216 includes a first AND gate AND1, a first inverter INV1, a second AND gate AND2, a fifth NMOS transistor N5, and a sixth NMOS transistor N6.

The first AND gate AND1 performs an AND operation on an enable signal EN and the setting signal RVRSB. The first inverter INV1 inverts the setting signal RVRSB. The second AND gate AND2 performs an AND operation on an output signal of the first inverter INV1 and the enable signal EN. The fifth NMOS transistor N5 is coupled between the first selection node SN1 and the common node CN1 and has a gate receiving an output signal of the second AND gate AND2.

The sixth NMOS transistor N6 is coupled between the second selection node SN2 and the common node CN1 and has a gate receiving the output signal of the first AND gate AND1. Here, the enable signal EN is activated when the semiconductor system is powered on.

In the inverting selection unit 216, the sixth NMOS transistor N6 is turned on when the setting signal RVRSB is activated to a logic high level in a state that enable signal EN is activated to a logic high level. Further, the fifth NMOS transistor N5 is turned on when the setting signal RVRSB is inactivated to a logic low level in a state that enable signal EN is activated to a logic high level. Accordingly, the inverting selection unit 216 may provide a current path between the differential selection nodes SN1 and SN2 and the common node CN1 by selectively connecting one of the differential selection nodes SN1 and SN2 with the common node CN1 in response to the setting signal RVRSB.

The sinking unit 218 is coupled between the common node CN1 and a ground voltage (VSS) terminal, and includes a current source.

Referring to FIG. 6, the setting control unit 220 includes a sampling unit 222 and an inverting setting unit 224.

The sampling unit 222 performs a sampling operation on the positive internal clock signal ICLKP and the negative internal clock signal ICLKN to output a sampling signal SAMP. The inverting setting unit 224 receives the sampling signal SAMP, and outputs the setting signal RVRSB in response to the reset signal RESETB. Herein, the setting signal RVRSB may be used as a mirror function activation signal (corresponding to "MF" shown in FIG. 1) for controlling an activation state of a mirror function. Moreover, the sampling unit 222 may include a comparator, and the inverting setting unit 224 may include a D flip-flop.

Figure 7:
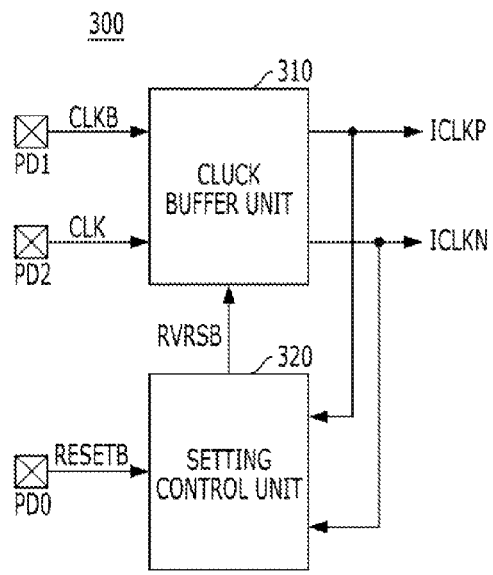
FIG. 7 is a block diagram illustrating a second semiconductor device shown in FIG. 3.
Figure 8:
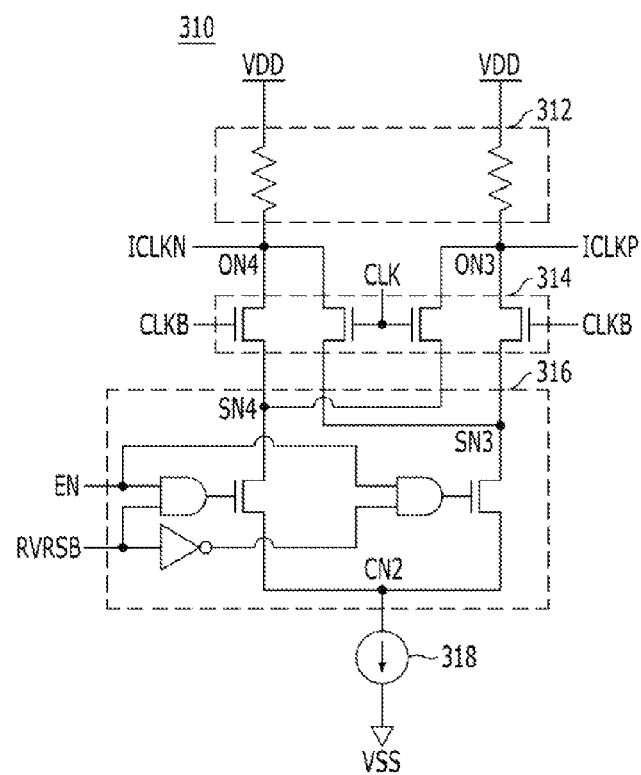
FIG. 8 is a circuit diagram illustrating a clock buffer unit shown in FIG. 7.
Figure 9:
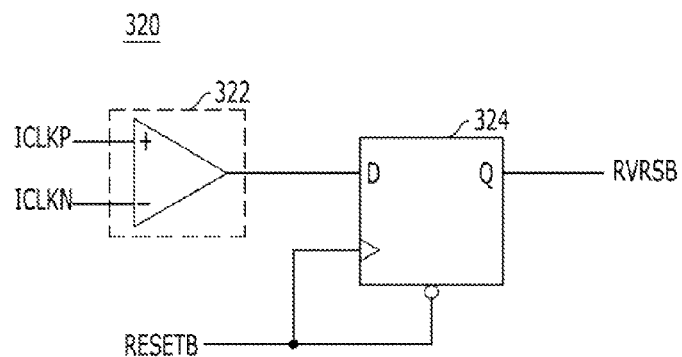
FIG. 9 is a circuit diagram illustrating a setting control unit shown in FIG. 7.

FIG. 7 is a block diagram illustrating the second semiconductor device shown in FIG. 3. FIG. 8 is a circuit diagram illustrating a clock buffer unit shown in FIG. 7. FIG. 9 is a circuit diagram illustrating a setting control unit shown in FIG. 7.

Meanwhile, since the second semiconductor device 300 shown in FIG. 7 is substantially the same as the first semiconductor device 200 shown in FIG. 4 except that a negative clock signal CLKB is received through a first pad PD1 and a positive dock signal CLK is received through a second pad PD2, the detailed descriptions of the second semiconductor device 300 will be omitted.

Moreover, since the clock buffer unit 310 shown in FIG. 8 is substantially the same as the clock buffer unit 210 shown in FIG. 5 except for an input arrangement of the differential clock signals CLK and CLKB, the detailed descriptions of the clock buffer unit 310 will be omitted. Further, since the setting control unit 320 shown in FIG. 9 is substantially the same as the setting control unit shown in 220 FIG. 6, the detailed descriptions of the setting control unit 320 will be omitted.

Figure 10:
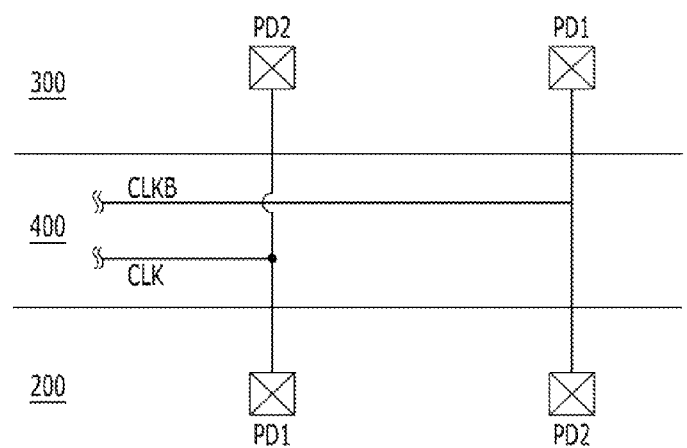
FIG. 10 is a diagram illustrating a routing path of different clock signals between the first semiconductor device and the second semiconductor device shown in FIG. 3.

FIG. 10 is a diagram illustrating a routing path of different clock signals between the first semiconductor device and the second semiconductor device shown in FIG. 3.

Referring to FIG. 10, the substrate 400 is disposed between the first semiconductor device 200 and the second semiconductor device 300, which are opposite to each other on the basis of the substrate 400, and electrically couples the controller 100 to the first semiconductor device 200 and the second semiconductor device 300. The substrate 400 includes first routing paths for transferring the positive clock signal CLK to the first pad PD1 of the first semiconductor device 200 and the second pad PD2 of the second semiconductor device 300, respectively, and second routing paths for transferring the negative dock signal CLKB to the second pad PD2 of the first semiconductor device 200 and the first pad PD1 of the first semiconductor device 300, respectively. Herein, the first routing paths are opposite to each other, and the second routing paths are opposite to each other. Thus, the first and second routing paths may be simplified.

Further, the first pad PD1 for the positive clock signal CLK of the first semiconductor device 200 is opposite to the second pad PD2 for the positive clock signal CLK of the second semiconductor device 300, and the second pad PD2 for the negative clock signal CLKB of the first semiconductor device 200 is opposite to the first pad PD1 for the negative clock signal CLKB of the second semiconductor device 300, on the basis of the substrate 400.

Hereinafter an operation of a semiconductor system having an aforementioned configuration in accordance with an exemplary embodiment of the present invention will be described with reference to FIGS. 3 to 12. In the exemplary embodiment of the present invention, it is assumed that the second semiconductor device 300 is the second semiconductor device 30 is set to a mirrored semiconductor device.

Figure 11:
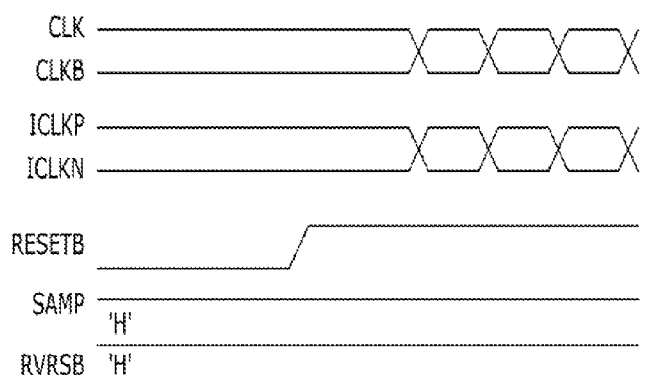
FIG. 11 is a timing diagram illustrating an operation of a first semiconductor device in accordance with an exemplary embodiment of the present invention.
Figure 12:
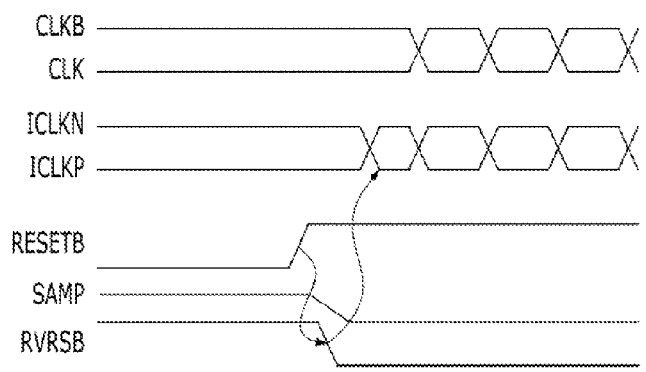
FIG. 12 is a timing diagram illustrating an operation of a second semiconductor device in accordance with an exemplary embodiment of the present invention.

FIG. 11 is a timing diagram illustrating an operation of the first semiconductor device in accordance with an exemplary embodiment of the present invention. FIG. 12 is a timing diagram illustrating an operation of the second semiconductor device in accordance with an exemplary embodiment of the present invention.

Referring to FIGS. 11 and 12, the controller 100 outputs the differential clock signals CLK and CLKB having a predetermined voltage level without toggling during a reset period when the reset signal RESETB has a logic low level. For example, the controller 100 outputs the positive clock signal CLK having a logic high level and the negative clock signal CLKB having a logic low level during the reset period. The controller 10 outputs the differential clock signals CLK and CLKB toggling in a predetermined time after the reset period is terminated, that is, the reset signal RESETB is shifted to a logic high level from a logic low level. Herein, the first and second semiconductor devices 200 and 300 generate internally the setting signal RVRSB based on a level state of the differential clock signals CLK and CLKB at a termination timing of the reset period, and use the setting signal RVRSB as a signal for controlling an activation of a mirror function.

Firstly, an operation of the first semiconductor device 200 will be described in details as below with reference to FIG. 11.

During the reset period when the reset signal RESETB has a logic low level, the clock buffer unit 210 generates the differential internal clock signals ICLKP and ICLKN corresponding to the differential clock signals CLK and CLKB in response to the setting signal RVRSB. For example, the clock buffer unit 210 outputs the positive internal clock signal ICLKP having a same logic level as the positive clock signal CLK, and outputs the negative internal clock signal ICLKN having a same logic level as the negative clock signal CLKB when the sixth NMOS transistor N6 is turned on in response to the setting signal RVRSB having a logic high level in a state that enable signal EN is activated to a logic high level.

The setting control unit 220 generates the setting signal RVRSB based on a level state of the differential internal clock signals ICLKP and ICLKN when the reset signal RESETB is inactivated to a logic high level from a logic low level after the reset period is terminated. For example, the sampling unit 222 outputs the sampling signal SAMP having a logic high level since the positive internal clock signal ICLKP has a voltage level higher than the negative internal clock signal ICLKN. The inverting setting unit 224 outputs the setting signal RVRSB having a logic high level in response to the sampling signal SAMP having a logic high level when the reset signal RESETB is inactivated to a logic high level from a logic low level. As a result, the setting control unit 220 outputs the setting signal RVRSB fixed to a logic high level irrespective of the reset signal RESETB.

Then, the clock buffer unit 210 outputs the differential internal clocks signals ICLKP and ICLKN, which have same value as previous differential internal clock signals. For example, the inverting selection unit 216 provides a current path between the second selection node SN2 and the common node CN1 in response to the setting signal RVRSB having a logic high level. The differential input unit 214 outputs the positive internal clock signal ICLKP having the same logic level as the positive clock signal CLK and outputs the negative internal clock signal ICLKN having the same logic level as the negative clock signal CLKB. As a result, the clock buffer unit 210 outputs the differential internal clock signals ICLKP and ICLKN corresponding to the differential clock signals CLK and CLKB irrespective of the reset signal RESETB.

Meanwhile, the setting signal RVRSB may be used as a signal for controlling the clock buffer unit 210, and may be used as a signal for controlling an activation of a mirror function with respect to the first semiconductor device 200. For example, the mirror function of the first semiconductor device 200 is inactivated in response to the setting signal RVRSB having a logic high level.

Next, an operation of the second semiconductor device 300 will be described in details as below with reference to FIG. 12.

During the reset period when the reset signal RESETB has a logic low level, the clock buffer unit 310 generates the differential internal clocks ICLKP and ICLKN corresponding to the differential clocks CLK and CLKB in response to the setting signal RVRSB. For example, the clock buffer unit 310 outputs the positive internal clock signal ICLKP having a same logic level as the positive clock signal CLK, and outputs the negative internal clock signal ICLKN having a same logic level as the negative dock signal CLKB when a current path between a fourth selection node SN4 and a common node CN2 is formed in response to the setting signal RVRSB having a logic high level in a state that enable signal EN is activated to a logic high level.

The setting control unit 320 generates the setting signal RVRSB based on a level state of the differential internal clock signals ICLKP and ICLKN when the reset signal RESETB is inactivated to a logic high level from a logic low level after the reset period is terminated. For example, the sampling unit 322 outputs the sampling signal SAMP having a logic low level since the negative internal clock signal ICLKN has a voltage level that is higher than the positive internal clock signal ICLKP. The inverting setting unit 324 outputs the setting signal RVRSB having a logic low level in response to the sampling signal SAMP having a logic low level when the reset signal RESETB is shifted to a logic high level from a logic low level. As a result, the setting control unit 320 outputs the setting signal RVRSB, which is shifted from a logic high level to a Logic low level when the reset signal RESETB is shifted from a logic low level to a logic high level.

Then, the clock buffer unit 310 inverts and outputs the differential internal clocks signals ICLKP and ICLKN. For example, the inverting selection unit 316 provides a current path between a third selection node SN3 and the common node CN1 in response to the setting signal RVRSB having a logic low level. The differential input unit 314 outputs the negative internal clock signal ICLKN having the same logic level as the positive clock signal CLK and outputs the positive internal clock signal ICLKP having the same logic level as the negative clock signal CLKB. As a result, the clock buffer unit 310 outputs the differential internal clock signals ICLKP and ICLKN, which are logically inverted, when the reset signal RESETB is shifted from a logic low level to a logic high level.

Meanwhile, the setting signal RVRSB may be used as a signal for controlling the clock buffer unit 310 when the reset signal RESETB is inactivated to a logic high level, and may be used as a signal for controlling an activation of a mirror function with respect to the second semiconductor device 300. For example, the mirror function of the second semiconductor device 300 is activated in response to the setting signal RVRSB having a logic low level, In exemplary embodiments of the present invention, since the differential clocks received through pads, which are physically coupled, may be re-distributed logically based on a mirror function of a semiconductor device, an area of the semiconductor device may be minimized. Moreover, since a signal for controlling a mirror function may be internally generated, a pad for controlling the mirror function may be removed. Since a routing path for transferring differential clock signals outputted from a controller to a plurality of semiconductor devices is simplified, a substrate may be easily designed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a buffer unit suitable for outputting a first signal of differential input signals as a positive signal, and a second signal of differential input signals as a negative signal in response to a setting signal; and
   a setting control unit suitable for generating the setting signal based on a level state of the positive signal and the negative signal in response to a reset signal,
   wherein the setting control unit includes:
      a sampling unit suitable for sampling the positive signal and the negative signal to output a sampling signal; and
      an inverting setting unit suitable for receiving the sampling signal and outputting the setting signal in response to the reset signal.

2. The semiconductor device of claim 1, wherein the buffer unit comprises:
   an inverting selection unit suitable for determining an inverting state of the positive signal and the negative signal in response to the setting signal; and
   a differential input unit suitable for inverting or non-inverting the differential input signals based on the inverting state of the positive signal and the negative signal.

3. The semiconductor device of claim 1, wherein the setting signal is a signal for controlling an activation of a mirror function.

4. The semiconductor device of claim 1, further comprising:
   a first pad suitable for receiving the first signal of the differential input signals;
   a second pad suitable for receiving the second signal of the differential input signals; and
   a third pad suitable for receiving the reset signal.

5. A semiconductor device comprising:
   a clock buffer unit suitable for outputting one of differential clock signals as a positive internal clock signal at a first output node, and the other of differential clock signals as a negative internal clock signal at a second output node in response to a setting signal;
   a sampling unit suitable for sampling the positive internal clock signal and the negative internal clock signal to output a sampling signal; and
   an inverting setting unit suitable for receiving the sampling signal and outputting the setting signal in response to a reset signal.

6. The semiconductor device of claim 5, wherein the clock buffer unit comprises:
   a load unit coupled between the first and second output nodes and a high voltage terminal;
   a differential input unit, coupled between the first and second output nodes and differential selection nodes, suitable for receiving the differential clock signals;
   an inverting selection unit suitable for providing a current path between the differential selection nodes and a common node by selectively connecting one of the differential selection nodes with the common node in response to the setting signal; and
   a sinking unit coupled between the common node and a low voltage terminal.

7. The semiconductor device of claim 5, wherein the setting signal is a signal for controlling an activation of a mirror function.

8. The semiconductor device of claim 5, further comprising:
   a first pad suitable for receiving a positive clock signal of the differential clock signals;
   a second pad suitable for receiving a negative clock signal of the differential clock signals; and
   a third pad suitable for receiving the reset signal.

9. A semiconductor system comprising:
   a controller suitable for generating differential signals and a reset signal; and
   first and second semiconductor devices, each suitable for outputting a first signal of the differential signals as a positive signal and a second signal of the differential signals as a negative signal based on a level state of the differential signals in response to the differential signals and the reset signal,
   wherein each of the first and second semiconductor device includes a setting control unit suitable for generating a setting signal based on the level state of the positive signal and the negative signal in response to the reset signal,
   wherein the setting control unit includes:
      a sampling unit suitable for sampling the positive signal and the negative signal to output a sampling signal; and
      an inverting setting unit suitable for receiving the sampling signal and outputting the setting signal in response to the reset signal.

10. The semiconductor system of claim 9, further comprising:
    a substrate disposed between the first semiconductor device and the second semiconductor device, suitable for electrically coupling the controller to the first and second semiconductor devices, which are opposite to each other on the basis of the substrate.

11. The semiconductor system of claim 10, wherein the substrate routes the first signal of the differential signals to the first and second semiconductor devices through first routing paths opposite to each other, and routes the second signal of the differential signals to the first and second semiconductor devices through second routing paths opposite to each other.

12. The semiconductor system of claim 10, wherein each of the first and second semiconductor devices includes:
- a first pad suitable for receiving the first signal of the differential signals;
- a second pad suitable for receiving the second signal of the differential signals; and
- a third pad suitable for receiving the reset signal.

13. The semiconductor system of claim 12, wherein the first pad of the first semiconductor device is opposite to the first pad of the second semiconductor device, and the second pad of the first semiconductor device is opposite to the second pad of the second semiconductor device, other on the basis of the substrate.

14. The semiconductor system of claim 10, wherein the first and second semiconductor devices are coupled to the substrate with a structure for implementing a mirror function.

15. The semiconductor system of claim 9, wherein the first and second semiconductor devices generate a signal for controlling an activation of a mirror function based on the level state of the differential signals.

16. The semiconductor system of claim 9, wherein each of the first and second semiconductor devices further includes:
- a buffer unit suitable for outputting the first signal of the differential signals as the positive signal, and the second signal of the differential signals as the negative signal in response to the setting signal.

17. The semiconductor system of claim 16, wherein the setting signal is a signal for controlling an activation of a mirror function.

18. The semiconductor system of claim 16, wherein the setting control unit includes:
- a sampling unit suitable for sampling the positive signal and the negative signal to output a sampling signal; and
- an inverting setting unit suitable for receiving the sampling signal and outputting the setting signal in response to the reset signal.

* * * * *